United States Patent
Hsieh et al.

(10) Patent No.: US 8,044,496 B2
(45) Date of Patent: Oct. 25, 2011

(54) QFN SEMICONDUCTOR PACKAGE

(75) Inventors: Tung-Hsien Hsieh, Changhua County (TW); Nan-Cheng Chen, Hsin-Chu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/840,307

(22) Filed: Jul. 21, 2010

(65) Prior Publication Data

US 2010/0283137 A1 Nov. 11, 2010

Related U.S. Application Data

(63) Continuation of application No. 12/390,492, filed on Feb. 22, 2009, now Pat. No. 7,786,557.

(60) Provisional application No. 61/054,172, filed on May 19, 2008.

(51) Int. Cl.
*H01L 23/495* (2006.01)

(52) U.S. Cl. ........ 257/676; 257/673; 257/684; 438/123; 438/126

(58) Field of Classification Search .................. 257/673, 257/676, 684, 690, E23.141; 438/123, 124, 438/125, 126
See application file for complete search history.

(56) References Cited

U.S. PATENT DOCUMENTS

| | | | |
|---|---|---|---|
| 6,238,952 B1 | 5/2001 | Lin | |
| 6,258,893 B1 | 7/2001 | Okayama | |
| 6,261,864 B1 | 7/2001 | Jung | |
| 6,306,685 B1 | 10/2001 | Liu | |
| 6,333,252 B1 | 12/2001 | Jung | |
| 6,342,730 B1 | 1/2002 | Jung | |
| 6,495,909 B2 | 12/2002 | Jung | |
| 6,507,115 B1 * | 1/2003 | Hofstee et al. | 257/777 |
| 6,621,140 B1 | 9/2003 | Gibson | |
| 6,642,627 B2 * | 11/2003 | Song et al. | 257/786 |
| 6,700,188 B2 | 3/2004 | Lin | |
| 6,861,295 B2 | 3/2005 | Jung | |
| 6,906,414 B2 | 6/2005 | Zhao | |
| 7,060,535 B1 * | 6/2006 | Sirinorakul et al. | 438/123 |
| 7,307,347 B2 * | 12/2007 | Yagi | 257/773 |
| 7,361,984 B2 * | 4/2008 | Wu et al. | 257/698 |
| 7,471,034 B2 | 12/2008 | Schlote-Holubek | |
| 2004/0178483 A1 | 9/2004 | Hsu | |

FOREIGN PATENT DOCUMENTS

JP 3167872 A 7/1991

* cited by examiner

*Primary Examiner* — Phuc Dang
(74) *Attorney, Agent, or Firm* — Winston Hsu; Scott Margo

(57) ABSTRACT

A QFN semiconductor package includes a die attach pad; a semiconductor die mounted on the die attach pad; an inner terminal lead disposed adjacent to the die attach pad; a first wire bonding the inner terminal lead to the semiconductor die; an extended, outer terminal lead disposed along periphery of the QFN semiconductor package, wherein the extended, outer terminal lead is disposed beyond a maximum wire length which is provided for a specific minimum pad opening size on the semiconductor die; an intermediary terminal disposed between the inner terminal lead and the extended, outer terminal lead; a second wire bonding the intermediary terminal to the semiconductor die; and a trace interconnecting the intermediary terminal to the extended, outer terminal lead.

12 Claims, 12 Drawing Sheets

QFN SEMICONDUCTOR PACKAGE

CROSS REFERENCE TO RELATED APPLICATIONS

This is a continuation of U.S. application Ser. No. 12/390,492 filed Feb. 22, 2009, now U.S. Pat. No. 7,786,557, which claims the benefit of U.S. provisional application No. 61/054,172 filed May 19, 2008, which is hereby incorporated by reference.

BACKGROUND OF THE INVENTION

1. Field of the Invention

The present invention relates generally to the field of chip packaging and, more particularly, to a high-pin-count quad flat non-leaded (QFN) semiconductor package having extended terminal leads and fabrication method thereof.

2. Description of the Prior Art

The handheld consumer market is aggressive in the miniaturization of electronic products. Driven primarily by the cellular phone and digital assistant markets, manufacturers of these devices are challenged by ever shrinking formats and the demand for more PC-like functionality. Additional functionality can only be achieved with higher performing logic IC's accompanied by increased memory capability. This challenge, combined together in a smaller PC board format, asserts pressure on surface mount component manufactures to design their products to command the smallest area possible.

Many of the components used extensively in today's handheld market are beginning to migrate from traditional leaded frame designs to non-leaded formats. The primary driver for handheld manufacturers is the saved PC board space created by these components' smaller mounting areas. In addition, most components also have reductions in weight and height, as well as an improved electrical performance. As critical chip scale packages are converted to non-leaded designs, the additional space saved can be allocated to new components for added device functionality. Since non-leaded designs can use many existing leadframe processes, costs to convert a production line can be minimized.

Similar to leaded components, nonleaded designs use wire bond as the primary interconnection between the IC and the frame. However, due to the unique land site geometry and form factor density, traditional wire bond processes may not produce high yielding production. For these designs, additional wire bond capabilities and alternate processes are needed to produce acceptable production yields.

U.S. Pat. No. 6,238,952 discloses a low-pin-count chip package including a die pad for receiving a semiconductor chip and a plurality of connection pads electrically coupled to the semiconductor chip wherein the die pad and the connection pads have a concave profile. A package body is formed over the semiconductor chip, the die pad and the connection pads in a manner that a potion of the die pad and a portion of each connection pad extend outward from the bottom of the package body.

U.S. Pat. No. 6,261,864 discloses a chip package. The semiconductor chip, the die pad, and the connection pads are encapsulated in a package body such that the lower surfaces of the die pad and the connection pads are exposed through the package body. The die pad and the connection pads are formed by etching such that they have a concave profile and a thickness far larger than that of conventional die pad and connection pads formed by plating.

U.S. Pat. No. 6,306,685 discloses a method of molding a bump chip carrier. Dry films are applied to the top and bottom surface of a copper base plate having a suitable thickness. A circuit pattern is formed on each one of the dry films. Metals are plated onto each of the circuit patterns to form connection pads and an exothermic passage. A die is mounted on the copper base plate. The surfaces of the copper base plate on which the die is mounted are molded to form a molding layer.

U.S. Pat. No. 6,342,730 discloses a package structure including a die pad for receiving a semiconductor chip and a plurality of connection pads electrically coupled to the semiconductor chip. The semiconductor chip, the die pad, and the connection pads are encapsulated in a package body such that the lower surfaces of the die pad and the connection pads are exposed through the package body. The die pad and the connection pads have a substantially concave profile.

U.S. Pat. No. 6,495,909 discloses a chip package. The semiconductor chip, the die pad, and the connection pads are encapsulated by a package body in a manner that the lower surfaces of the die pad and the connection pads are exposed through the package body. The die pad and the connection pads have a T-shaped profile thereby prolonging the time for moisture diffusion into the package.

U.S. Pat. No. 6,621,140 discloses a semiconductor package with inductive segments integrally formed in the leadframe. The inductive segments may be connected directly to a lead of the leadframe, or indirectly to a lead or a bond pad on a semiconductor die via wirebonds to form an inductor.

SUMMARY OF THE INVENTION

It is one objective to provide a high-pin-count quad flat non-leaded (QFN) semiconductor package having extended terminal leads and fabrication method thereof.

According to one embodiment of this invention, a quad flat non-lead (QFN) semiconductor package includes a die attach pad having a recessed area; a semiconductor die mounted inside the recessed area of the die attach pad, the die attach pad having an exposed bottom surface; at least one row of inner terminal leads disposed adjacent to the die attach pad; first wires bonding respectively the inner terminal leads to the semiconductor die; at least one row of extended, outer terminal leads disposed along periphery of the QFN semiconductor package; at least one row of intermediary terminals disposed between the inner terminal leads and the extended, outer terminal leads; second wires bonding respective the intermediary terminals to the semiconductor die; and third wires bonding respective the intermediary terminals to the extended, outer terminal leads.

In one aspect, a QFN semiconductor package includes a die attach pad having a recessed area; a semiconductor die mounted inside the recessed area of the die attach pad; at least one row of inner terminal leads disposed adjacent to the die attach pad; first wires bonding respective the inner terminal leads to the semiconductor die; at least one row of extended, outer terminal leads disposed along periphery of the QFN semiconductor package; at least one row of intermediary terminals disposed between the inner terminal leads and the extended, outer terminal leads; second wires bonding respective the intermediary terminals to the semiconductor die; and a trace interconnecting one of the intermediary terminals to one of the extended, outer terminal leads.

In another aspect, a QFN semiconductor package includes a die attach pad; a semiconductor die mounted on the die attach pad; an inner terminal lead disposed adjacent to the die attach pad; a first wire bonding the inner terminal lead to the semiconductor die; an extended, outer terminal lead disposed along periphery of the QFN semiconductor package, wherein the extended, outer terminal lead is disposed beyond a maximum wire length which is provided for a specific minimum pad opening size on the semiconductor die; an intermediary terminal disposed between the inner terminal lead and the extended, outer terminal lead; a second wire bonding the intermediary terminal to the semiconductor die; and a trace interconnecting the intermediary terminal to the extended, outer terminal lead.

In another aspect, a QFN semiconductor package includes a die attach pad; a semiconductor die mounted on the die attach pad; an inner terminal lead disposed adjacent to the die attach pad; a first wire bonding the inner terminal lead to the semiconductor die; an extended, outer terminal lead disposed along periphery of the QFN semiconductor package; an intermediary terminal disposed between the inner terminal lead and the extended, outer terminal lead, wherein the intermediary terminal occupies a smaller bonding surface area than that of the extended, outer terminal lead; a second wire bonding the intermediary terminal to the semiconductor die; and a trace interconnecting the intermediary terminal to the extended, outer terminal lead.

In still another aspect, a QFN semiconductor package includes a die attach pad; a semiconductor die mounted on the die attach pad; an inner terminal lead disposed adjacent to the die attach pad; a first wire bonding the inner terminal lead to the semiconductor die; an extended, outer terminal lead disposed along periphery of the QFN semiconductor package; an intermediary terminal disposed between the inner terminal lead and the extended, outer terminal lead, wherein the intermediary terminal has a recessed bottom surface that is not coplanar with a bottom bonding surface of the inner terminal lead and the extended, outer terminal lead; a second wire bonding the intermediary terminal to the semiconductor die; and a trace interconnecting the intermediary terminal to the extended, outer terminal lead.

In still another aspect, a QFN semiconductor package includes a die attach pad; a semiconductor die mounted on the die attach pad; an inner terminal lead disposed adjacent to the die attach pad; a first wire bonding the inner terminal lead to the semiconductor die; an extended, outer terminal lead disposed along periphery of the QFN semiconductor package; an intermediary terminal disposed between the inner terminal lead and the extended, outer terminal lead, wherein the intermediary terminal occupies a bonding surface area substantially equal to that of the extended, outer terminal lead; a second wire bonding the intermediary terminal to the semiconductor die; and a trace interconnecting the intermediary terminal to the extended, outer terminal lead.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
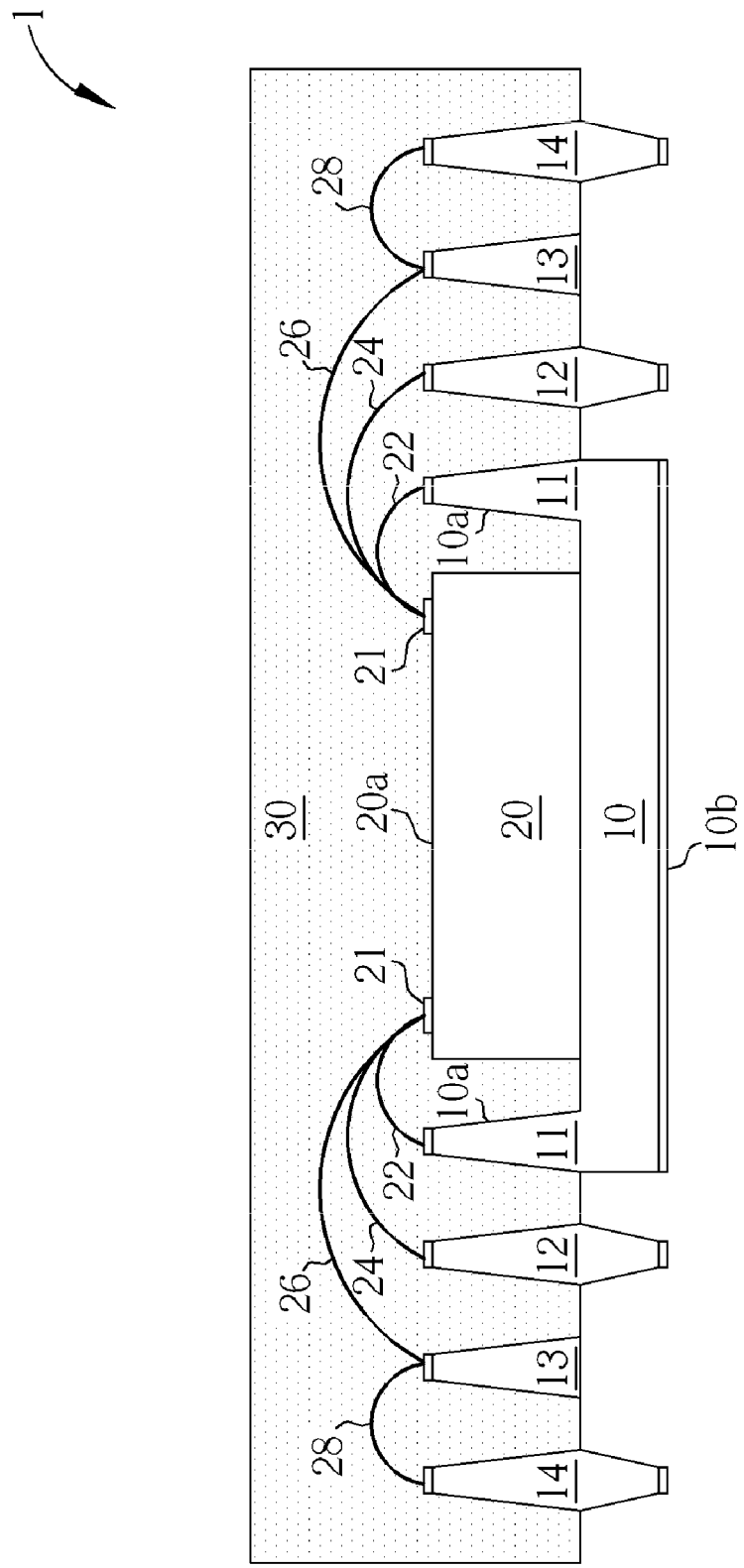
FIG. 1 is a schematic, cross-sectional diagram illustrating a quad flat non-lead (QFN) semiconductor package with intermediary terminals in accordance with one embodiment of this invention.
Figure 2:
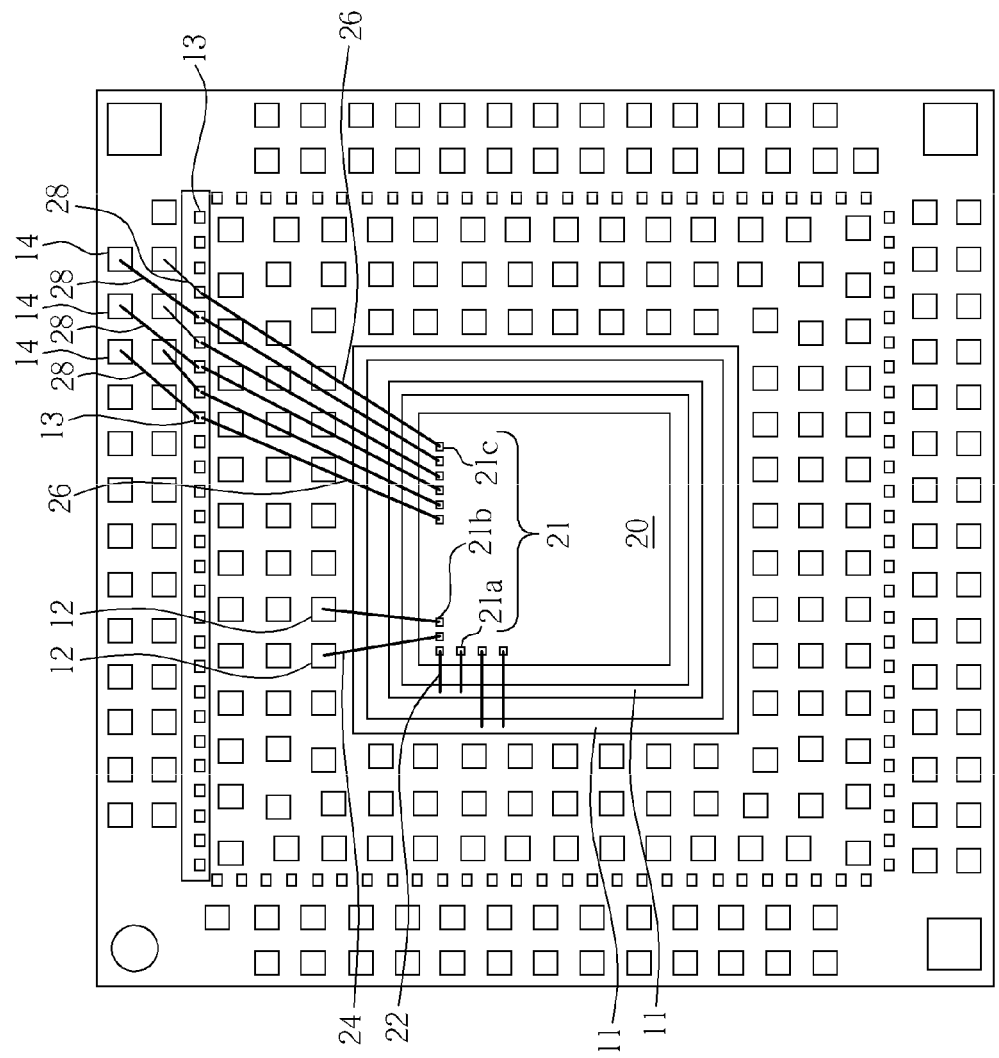
FIG. 2 is a top view of the exemplary layout of the QFN semiconductor package with intermediary terminals in accordance with the embodiment of this invention.

Please refer to FIG. 1 and FIG. 2. FIG. 1 is a schematic, cross-sectional diagram illustrating a quad flat non-lead (QFN) semiconductor package with intermediary terminals in accordance with one embodiment of this invention. FIG. 2 is a top view of the exemplary layout of the QFN semiconductor package with intermediary terminals in accordance with the embodiment of this invention. As shown in FIG. 1 and FIG. 2, the QFN semiconductor package 1 includes a die attach pad 10 having a recessed area 10a. A semiconductor die 20 is mounted inside the recessed area 10a of the die attach pad 10. The die attach pad 10 has a bottom surface 10b that is exposed within the mold cap 30. The die attach pad 10 may comprises a power or ground ring 11. At least one row of inner terminal leads 12 is disposed adjacent to the die attach pad 10. At least one row of extended, outer terminal leads 14 is disposed along the periphery of the QFN semiconductor package 1. At least one row of intermediary terminals 13 is disposed between the inner terminal leads 12 and the extended, outer terminal leads 14. According to another embodiment of this invention, the die attach pad 10 may be omitted.

The semiconductor die 20 has a top surface 20a with a plurality of bonding pads 21 including bonding pads 21a, 21b and 21c. The bonding pads 21a on the semiconductor die 20 are wire bonded to the power or ground ring 11 through the gold wires 22. The bonding pads 21b on the semiconductor die 20 are wire bonded to the inner terminal leads 12 through the gold wires 24. The bonding pads 21c on the semiconductor die 20 are wire bonded to the intermediary terminals 13 through the gold wires 26.

According to this embodiment, the outer terminal leads 14 are disposed beyond the maximum wire length that a wire bonding tool or wire bonder can provide for a specific minimum pad opening size. It is known that the maximum wire length that a wire bonder can provide depends upon the minimum pad opening size of the bonding pads on the die.

For example, for the bonding pads 21 having a minimum pad opening size of 43 micrometers, a typical wire bonder can only provide a maximum wire length of 140 mils (3556 micrometers). According to the exemplary embodiment of this invention, the gold wires 26 have the maximum wire length that a wire bonding tool or wire bonder can provide for a specific minimum pad opening size. In order to electrically interconnect the bonding pads 21c with the outer terminal leads 14, the intermediary terminals 13 are wire bonded to the corresponding outer terminal leads 14 through gold wires 28.

It is understood that the arrangement or layout of the single row of the intermediary terminals 13 is merely exemplary and should not be used to limit the scope of this invention. In another case, the intermediary terminals 13 may be arranged in two or more rows, or may be arranged alternately in two rows. According to this embodiment, each of the intermediary terminals 13 could occupy a smaller bonding surface area than each of the outer terminal leads 14 that has a bonding surface area substantially equal to each of the inner terminal leads 12.

The smaller intermediary terminals 13 are best seen in FIG. 2. For example, each of the inner terminal leads 12 and the outer terminal leads 14 has a dimension of 270 μm×270 μm, and each of the intermediary terminals 13 has a dimension of 150 μm×150 μm. It is to be understood that the bonding surface area of each of the intermediary terminals 13 must be adequate to accommodate two squash balls (not explicitly shown) of the two gold wires 26 and 28.

Figure 3:
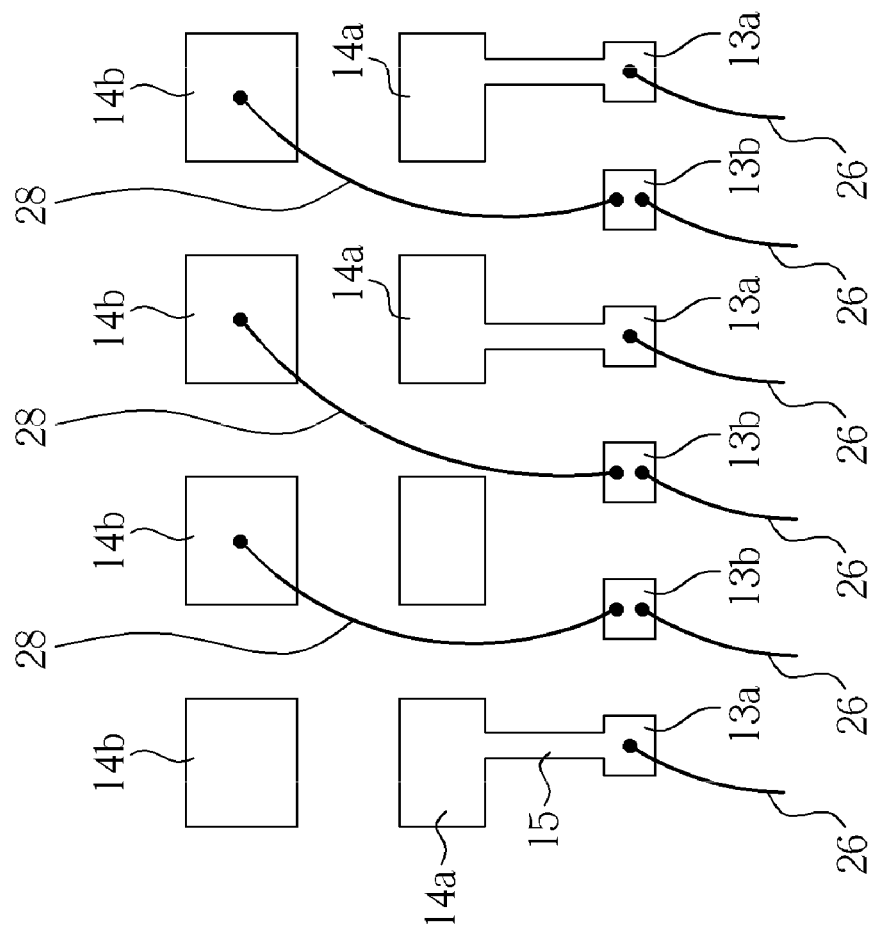
FIG. 3 is a schematic, enlarged top view showing the interconnection between the outer terminal leads and the intermediary terminals in accordance with another embodiment of this invention.

FIG. 3 is a schematic, enlarged top view showing the interconnection between the outer terminal leads and the intermediary terminals in accordance with another embodiment of this invention. As shown in FIG. 3, the outer terminal lead 14a in a first row is electrically interconnected to the intermediary terminal 13a through a trace 15, while the outer terminal lead 14b in a farther second row is electrically interconnected to the intermediary terminal 13a through the gold wire 28.

Figure 4:
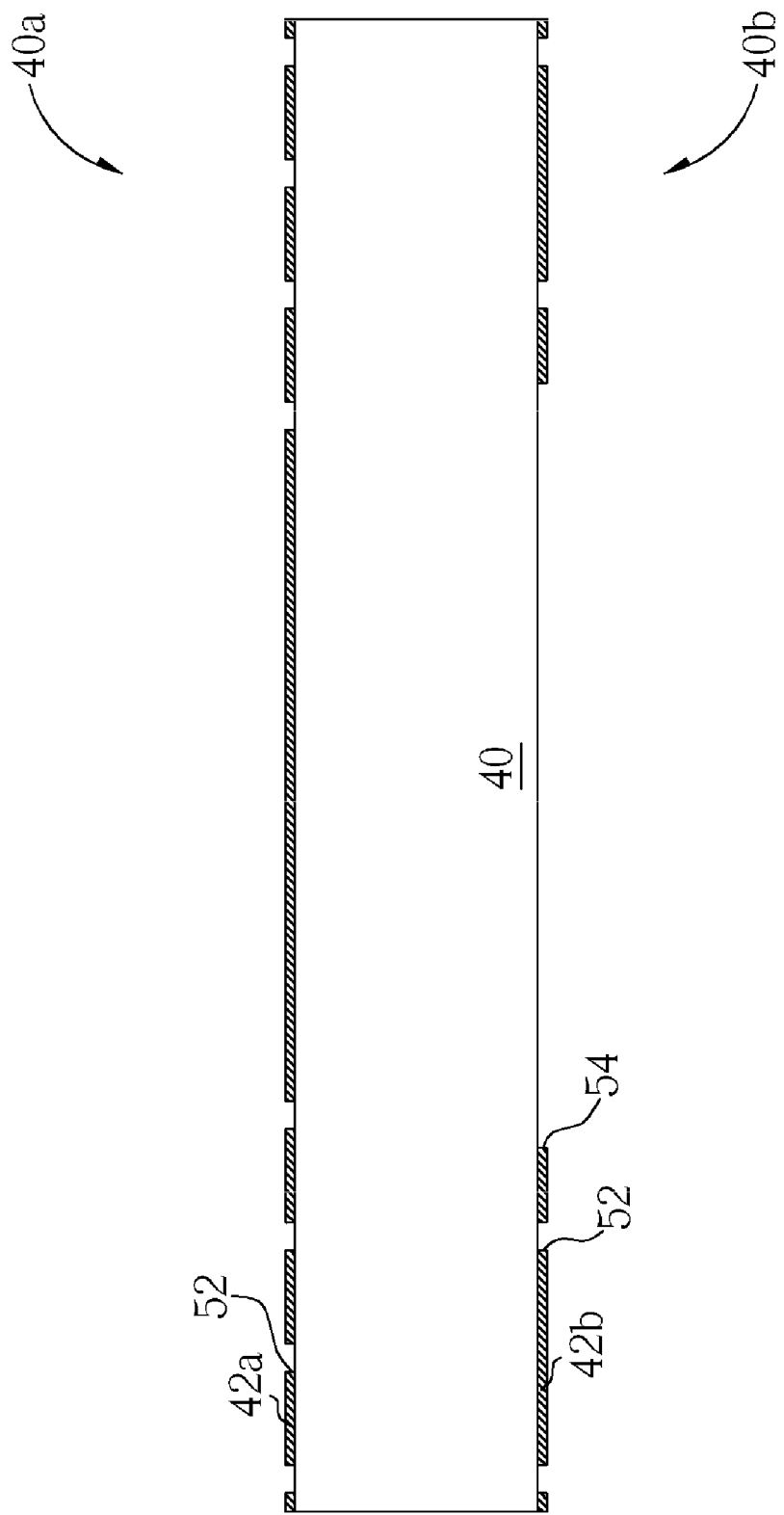
FIG. 4 to FIG. 11 are schematic, cross-sectional diagrams showing an exemplary method for making the QFN semiconductor package of FIG. 1.

FIG. 4 to FIG. 11 are schematic, cross-sectional diagrams showing an exemplary method for making the QFN semiconductor package 1 with intermediary terminals of FIG. 1, wherein like numeral numbers designate like regions, layers or elements. As shown in FIG. 4, a copper carrier 40 is provided. A patterned photoresist film 42a and a patterned photoresist film 42b are formed respectively on the opposite first and second sides 40a and 40b of the copper carrier 40 for defining lead array patterns 52 and a die attach pad pattern 54 thereon.

Figure 5:
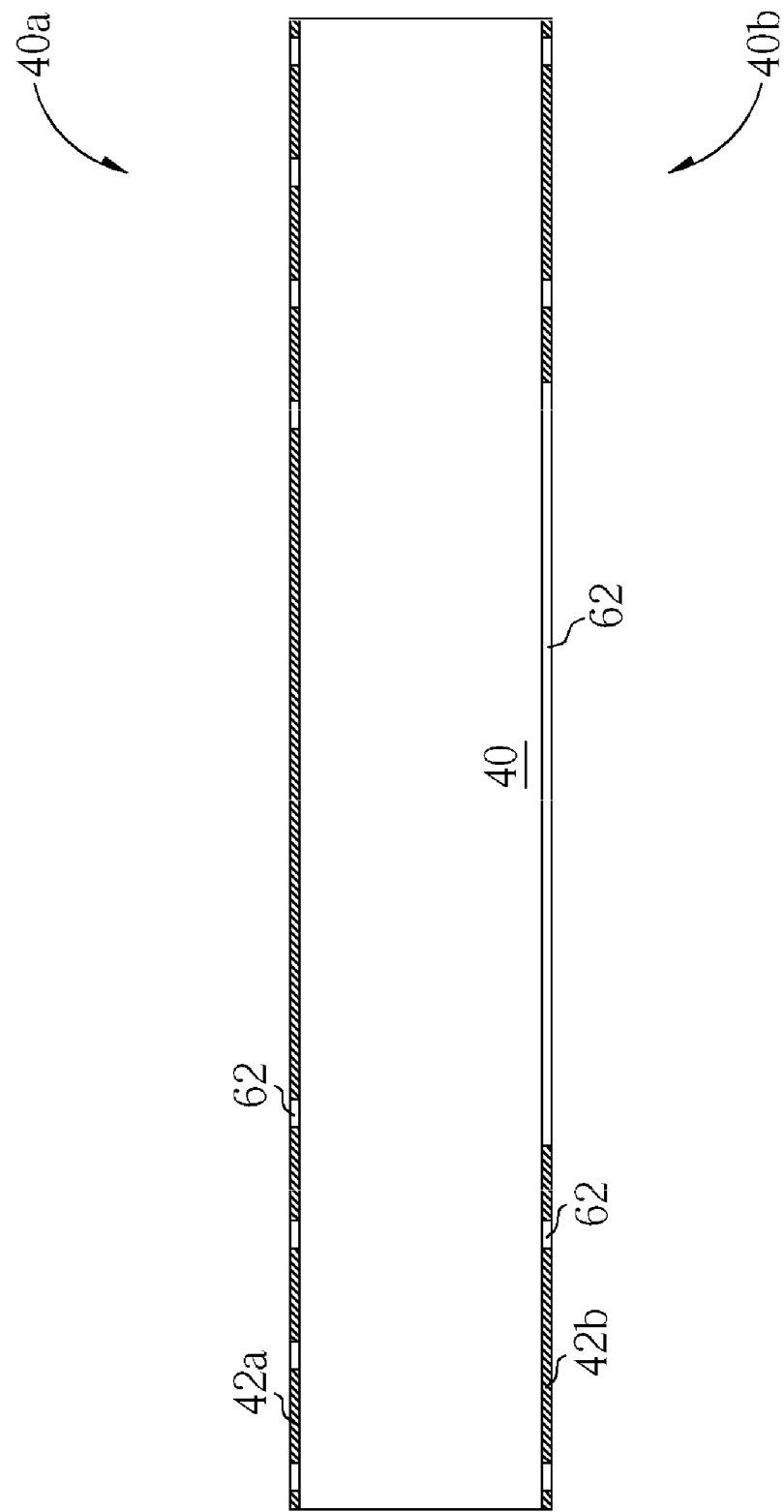
Figure 6:
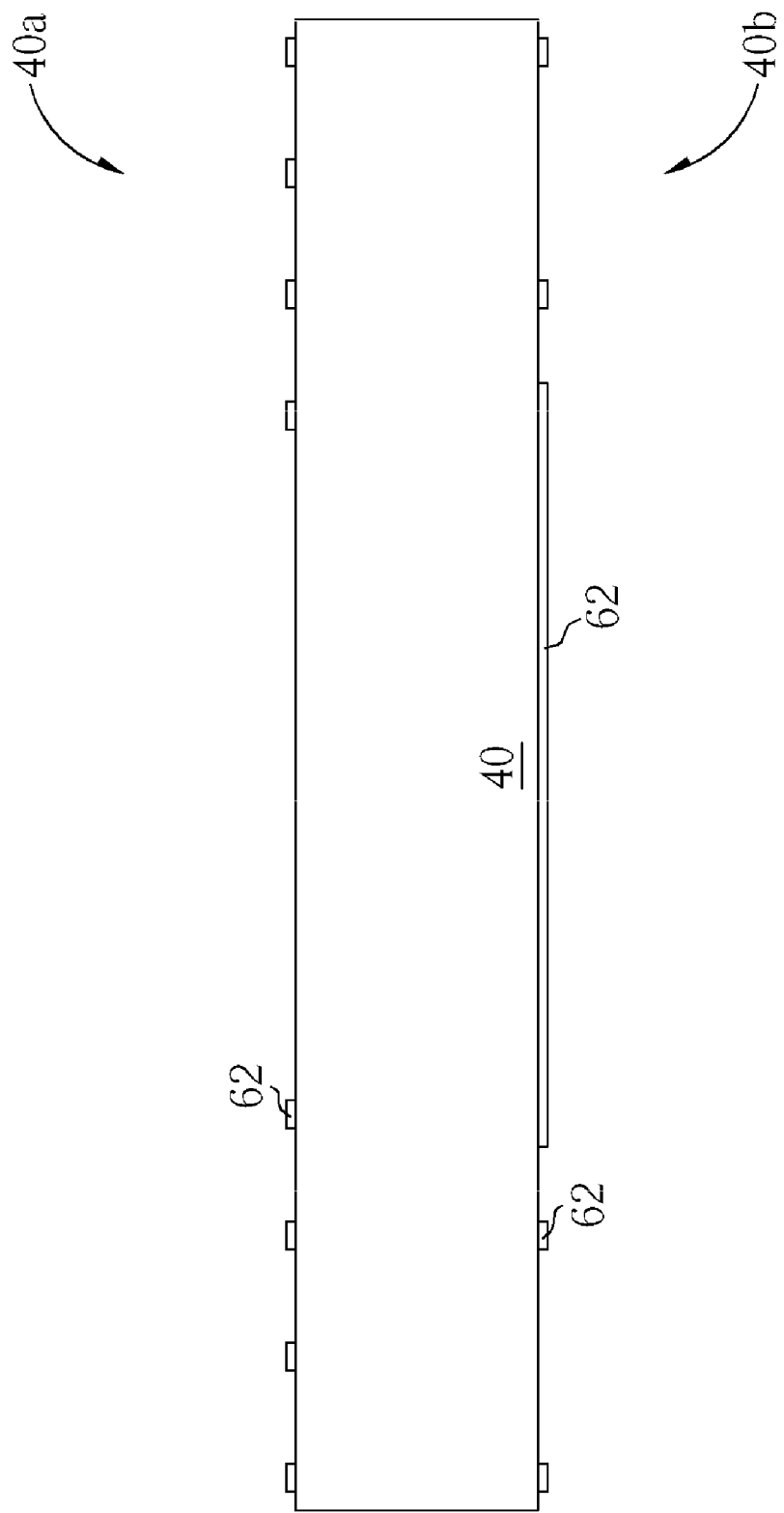

As shown in FIG. 5, a plating process is carried out to fill the lead array patterns 52 and the die attach pad pattern 54 on the two opposite sides of the copper carrier 40 with a bondable metal layer 62 such as nickel, gold or combination thereof. As shown in FIG. 6, the patterned photoresist film 42a and the patterned photoresist film 42b are stripped off to expose a portion of the surface of the copper carrier 40.

Figure 7:
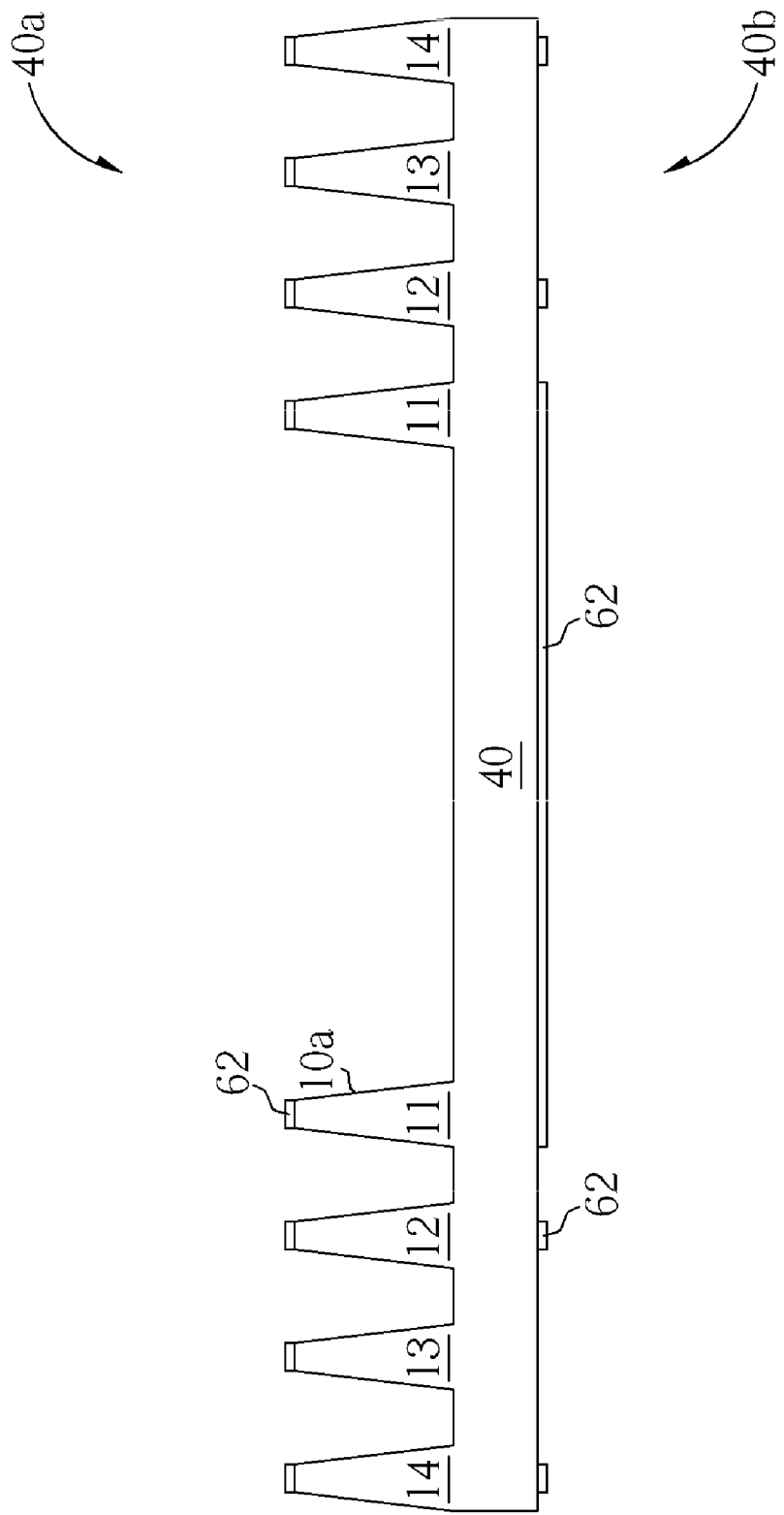

As shown in FIG. 7, subsequently, a copper etching process is performed to half etch the exposed portion of the copper carrier 40 from the first side 40a. A recessed area 10a is formed on the first side 40a. During the copper etching process, the bondable metal layer 62 acts as an etching hard mask. According to this embodiment, the steps described through FIG. 4 to FIG. 7 may be performed in a leadframe manufacturing factory.

Figure 8:
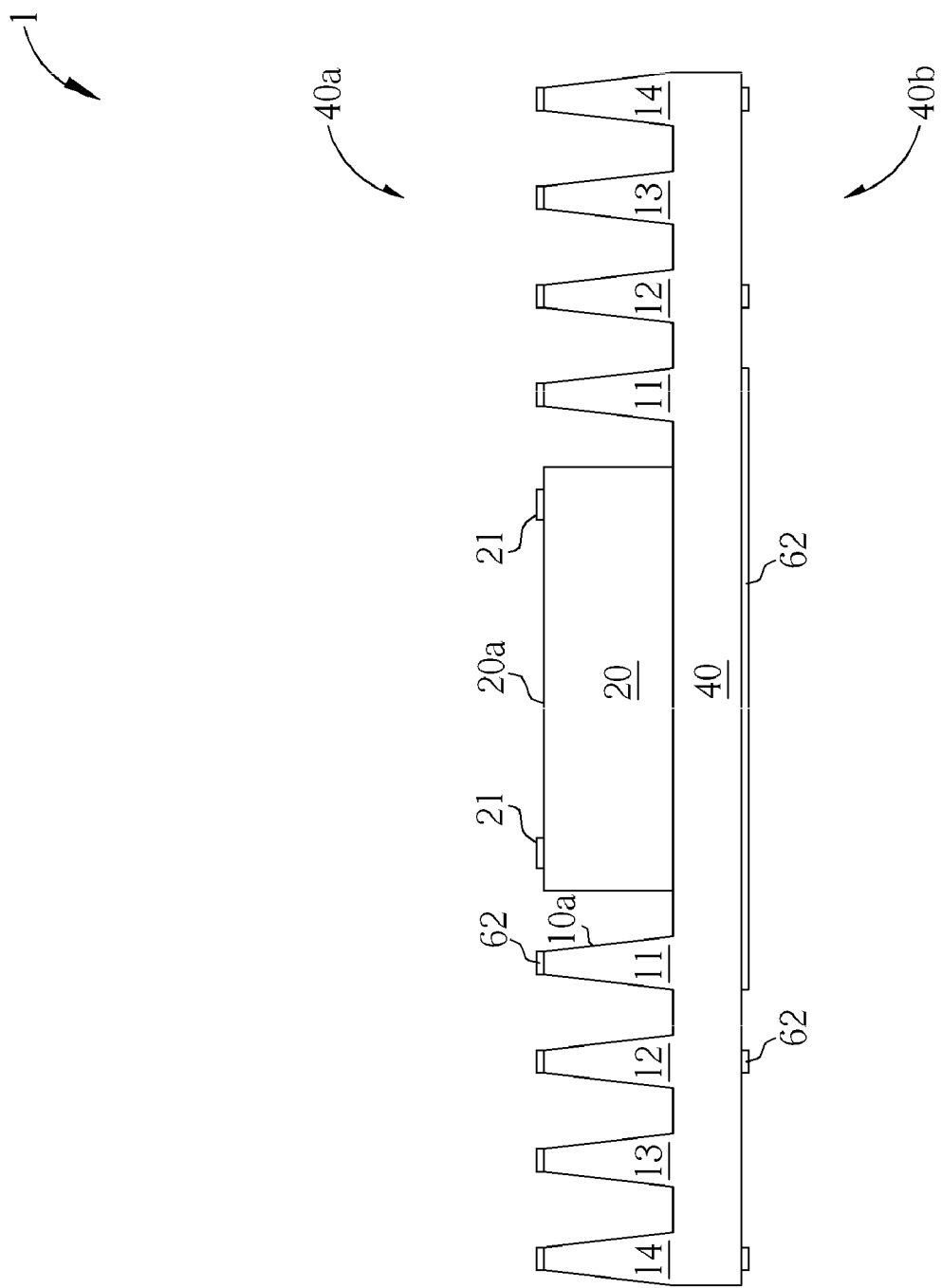

As shown in FIG. 8, a semiconductor die 20 is mounted inside the recessed area 10a, for example, by surface mount technology (SMT) or any other suitable methods. The semiconductor die 20 has a top surface 20a with a plurality of bonding pads, which are not explicitly shown.

Figure 9:
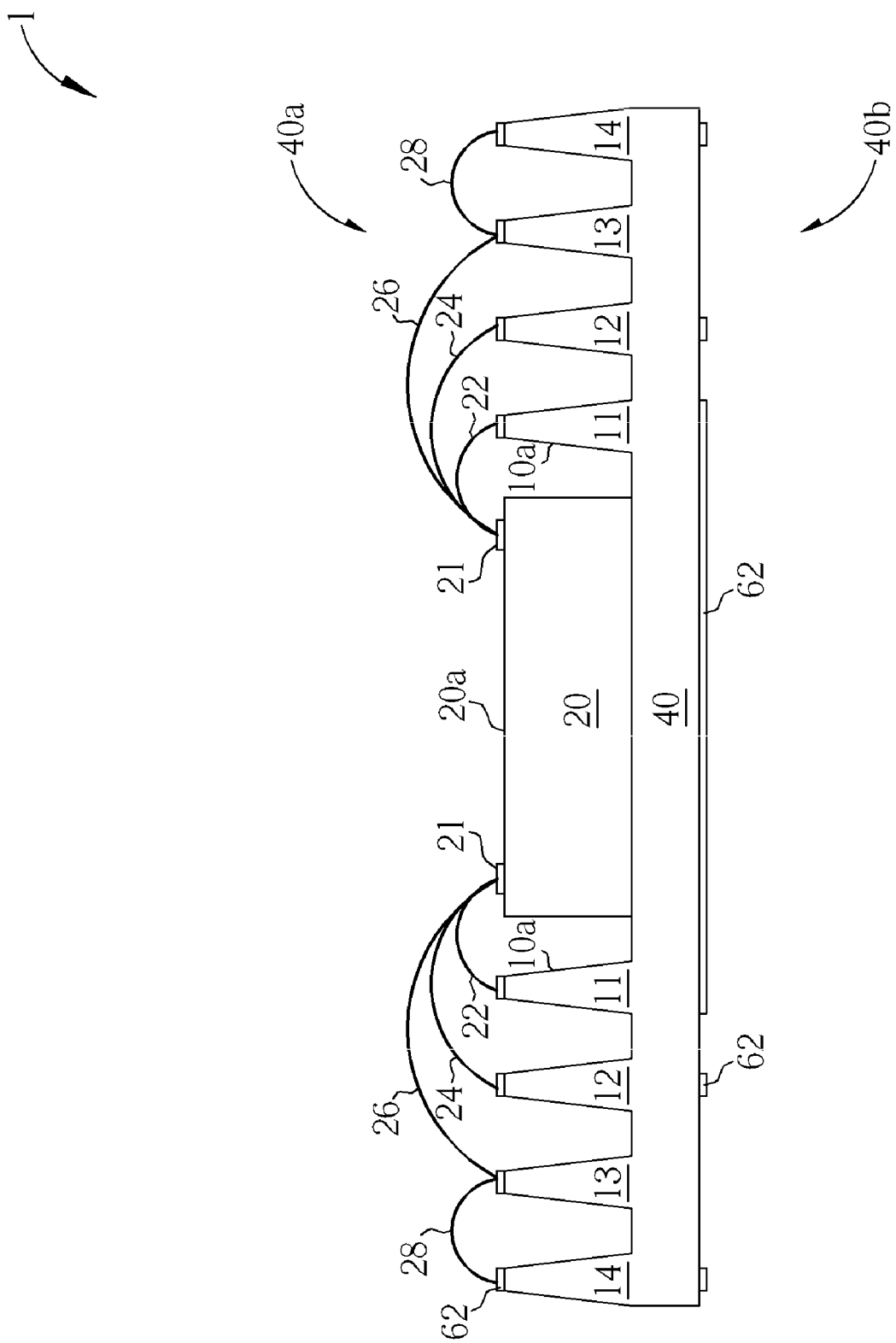

As shown in FIG. 9, a wire bonding process is carried out to electrically interconnect the bonding pads on the top surface 20a of the semiconductor die 20 with the corresponding terminal leads through gold wires 22, 24, 26 and 28 respectively. As previously mentioned, the maximum wire length that a wire bonder can provide in the wire bonding process depends upon the minimum pad opening size of the bonding pads on the semiconductor die 20. For example, for the bonding pads having minimum pad opening size of 43 micrometers, a typical wire bonder can only provide a maximum wire length of 140 mils (3556 micrometers). According to this embodiment, the gold wires 26 have the maximum wire length that a wire bonding tool or wire bonder can provide for a specific minimum pad opening size.

Figure 10:
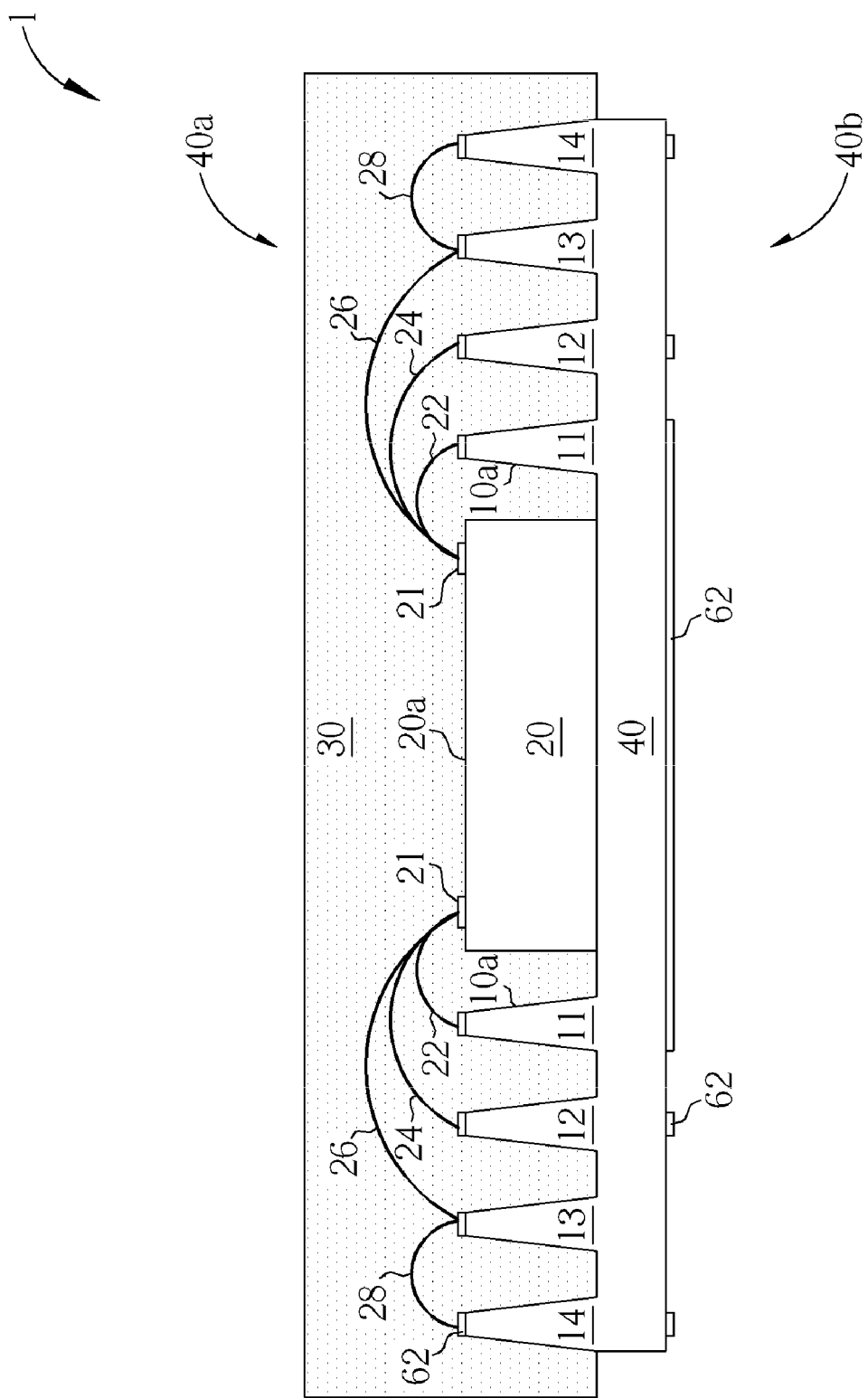

As shown in FIG. 10, a molding process is performed. The semiconductor die 20, gold wires 22, 24, 26 and 28, and the first side 40a of the copper carrier 40 is encapsulated within a mold cap 30 such as epoxy resins.

Figure 11:
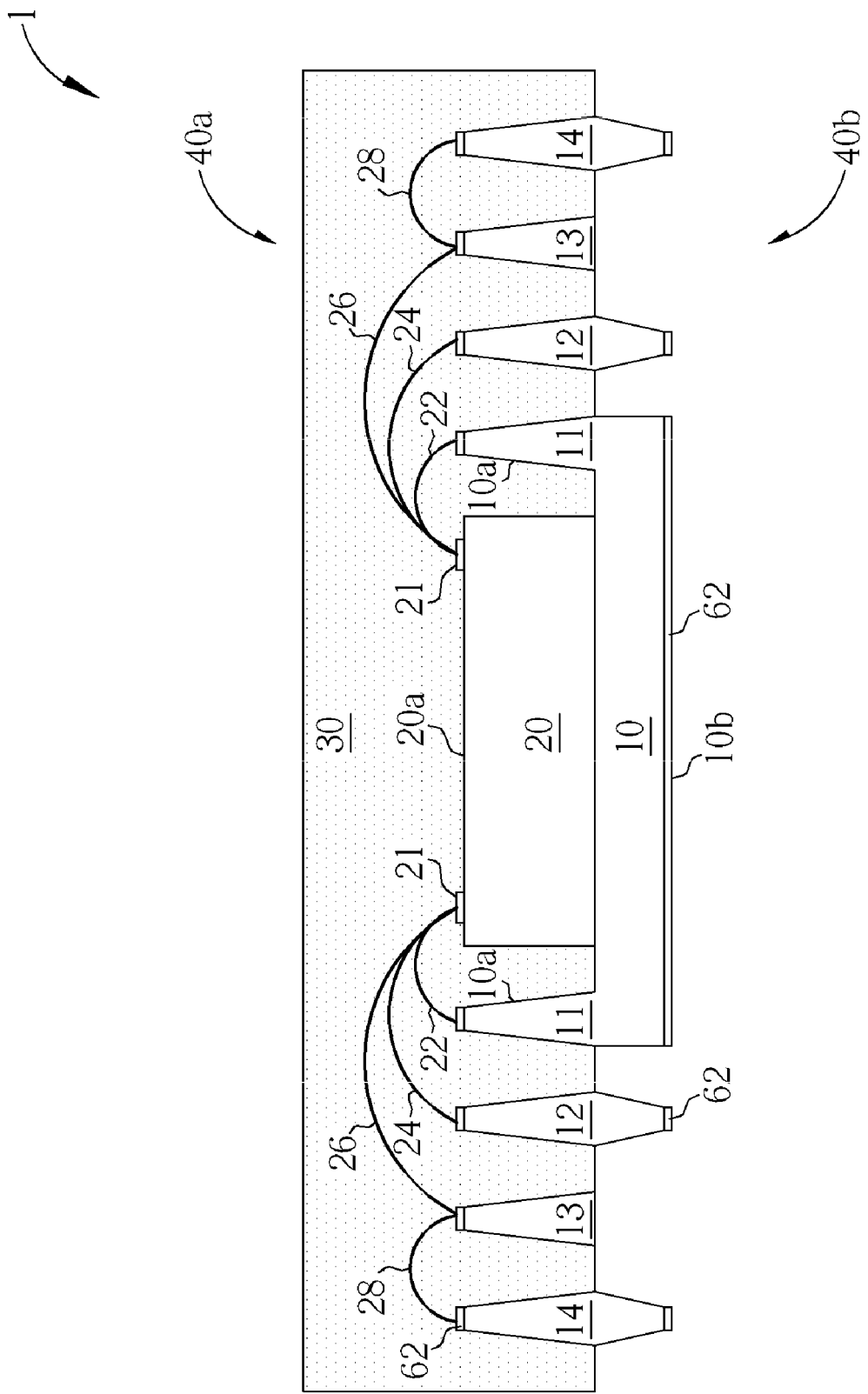

As shown in FIG. 11, after the molding process, a copper etching process is performed to half etch the exposed copper carrier 40 that is not covered by the bondable metal layer 62 from the second side 40b, thereby forming die attach pad 10, power or ground ring 11, inner terminal leads 12, intermediary terminals 13 and the outer terminal leads 14. According to this embodiment, the power or ground ring 11 is integrally formed with the die attach pad 10 and is annular-shaped. The power or ground ring 11 may be continuous or discontinuous. The die attach pad 10, the inner terminal leads 12 and the outer terminal leads 14 have exposed bottom surfaces 10b, 12b and 14b respectively, which are substantially coplanar. The exposed bottom surfaces 10b, 12b and 14b of the die attach pad 10, the inner terminal leads 12 and the outer terminal leads 14 respectively are eventually bonded to a printed circuit board. The intermediary terminal 13 has a recessed bottom surface 13b that is not coplanar with any of the exposed bottom surfaces 10b, 12b and 14b. According to this embodiment, the steps described through FIG. 8 to FIG. 11 may be performed in an assembly or packaging house.

Figure 12:
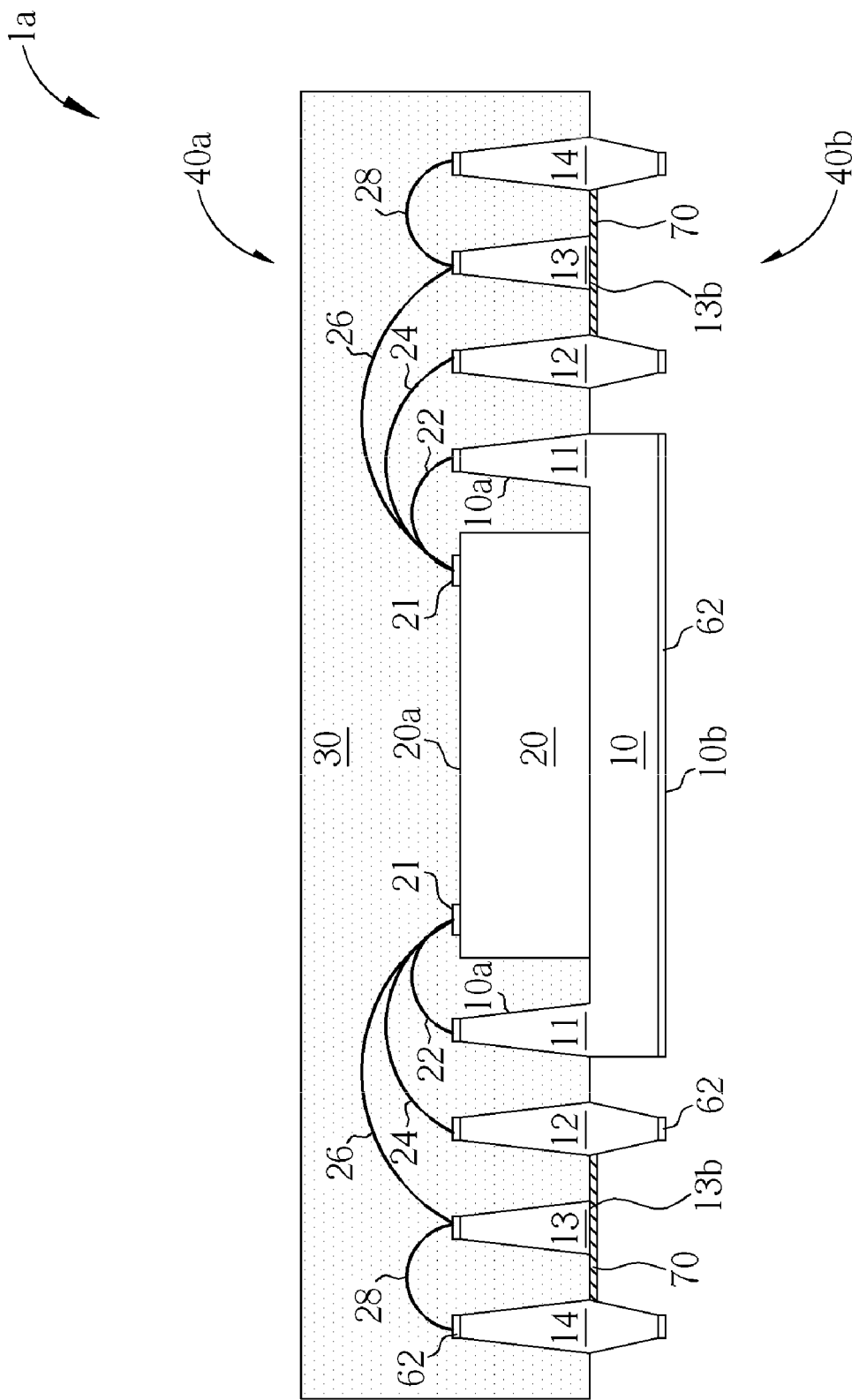
FIG. 12 is a schematic, cross-sectional diagram illustrating a QFN semiconductor package with intermediary terminals in accordance with still another embodiment of this invention.

FIG. 12 is a schematic, cross-sectional diagram illustrating a QFN semiconductor package with intermediary terminals in accordance with still another embodiment of this invention. As shown in FIG. 12, the difference between the QFN semiconductor package 1 of FIG. 1 and the QFN semiconductor package 1a of FIG. 12 is that in FIG. 12 the bottom surface 13b of the intermediary terminal 13 is covered with a protection layer 70 such as glue or any suitable insulating materials for avoiding shorting with the printed circuit board.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A quad flat non-lead (QFN) semiconductor package, comprising:
  a die attach pad;
  a semiconductor die mounted on the die attach pad;
  an inner terminal lead disposed adjacent to the die attach pad;
  a first wire bonding the inner terminal lead to the semiconductor die;
  an extended, outer terminal lead disposed along periphery of the QFN semiconductor package, wherein the extended, outer terminal lead is disposed beyond a maximum wire length that a wire bonder can provide with respect to a specific minimum pad opening size on the semiconductor die;
  an intermediary terminal disposed between the inner terminal lead and the extended, outer terminal lead;
  a second wire bonding the intermediary terminal to the semiconductor die; and
  a trace interconnecting the intermediary terminal to the extended, outer terminal lead.

2. The QFN semiconductor package according to claim 1 further comprising a mold cap encapsulating the semiconductor die and the first and second wires.

3. The QFN semiconductor package according to claim 1 wherein the intermediary terminal occupies a smaller bonding surface area than that of the extended, outer terminal lead.

4. The QFN semiconductor package according to claim 1 wherein the intermediary terminal has a recessed bottom surface that is not coplanar with a bottom bonding surface of each of the inner terminal lead and the extended, outer terminal lead.

5. The QFN semiconductor package according to claim 4 wherein the recessed bottom surface is covered with a protection layer.

6. A quad flat non-lead (QFN) semiconductor package, comprising:
   a die attach pad;
   a semiconductor die mounted on the die attach pad;
   an inner terminal lead disposed adjacent to the die attach pad;
   a first wire bonding the inner terminal lead to the semiconductor die;
   an extended, outer terminal lead disposed along periphery of the QFN semiconductor package;
   an intermediary terminal disposed between the inner terminal lead and the extended, outer terminal lead, wherein the intermediary terminal occupies a bonding surface area smaller than that of the extended, outer terminal lead;
   a second wire bonding the intermediary terminal to the semiconductor die; and
   a trace interconnecting the intermediary terminal to the extended, outer terminal lead.

7. The QFN semiconductor package according to claim 6 further comprising a mold cap encapsulating the semiconductor die and the first and second wires.

8. The QFN semiconductor package according to claim 6 wherein the intermediary terminal has a recessed bottom surface that is not coplanar with a bottom bonding surface of the inner terminal lead and the extended, outer terminal lead.

9. The QFN semiconductor package according to claim 8 wherein the recessed bottom surface is covered with a protection layer.

10. A quad flat non-lead (QFN) semiconductor package, comprising:
    a die attach pad;
    a semiconductor die mounted on the die attach pad;
    an inner terminal lead disposed adjacent to the die attach pad;
    a first wire bonding the inner terminal lead to the semiconductor die;
    an extended, outer terminal lead disposed along periphery of the QFN semiconductor package;
    an intermediary terminal disposed between the inner terminal lead and the extended, outer terminal lead, wherein the intermediary terminal has a recessed bottom surface that is not coplanar with a bottom bonding surface of the inner terminal lead and the extended, outer terminal lead;
    a second wire bonding the intermediary terminal to the semiconductor die; and
    a trace interconnecting the intermediary terminal to the extended, outer terminal lead.

11. The QFN semiconductor package according to claim 10 further comprising a mold cap encapsulating the semiconductor die and the first and second wires.

12. The QFN semiconductor package according to claim 10 wherein the recessed bottom surface is covered with a protection layer.

* * * * *